United States Patent
Osuga et al.

(10) Patent No.: US 10,756,169 B2
(45) Date of Patent: Aug. 25, 2020

(54) SEMICONDUCTOR DEVICE AND METHOD OF MANUFACTURING THE SAME

(71) Applicant: ABLIC Inc., Chiba-shi, Chiba (JP)

(72) Inventors: Yuki Osuga, Chiba (JP); Hirofumi Harada, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/359,391

(22) Filed: Mar. 20, 2019

(65) Prior Publication Data

US 2019/0305079 A1 Oct. 3, 2019

(30) Foreign Application Priority Data

Mar. 27, 2018 (JP) ................ 2018-060315

(51) Int. Cl.
| | |
|---|---|
| *H01L 29/06* | (2006.01) |
| *H01L 29/78* | (2006.01) |
| *H01L 29/10* | (2006.01) |
| *H01L 29/08* | (2006.01) |
| *H01L 21/266* | (2006.01) |
| *H01L 21/265* | (2006.01) |
| *H01L 29/66* | (2006.01) |

(52) U.S. Cl.
CPC .......... *H01L 29/063* (2013.01); *H01L 21/266* (2013.01); *H01L 21/26513* (2013.01); *H01L 29/086* (2013.01); *H01L 29/0878* (2013.01); *H01L 29/1095* (2013.01); *H01L 29/66734* (2013.01); *H01L 29/7813* (2013.01)

(58) Field of Classification Search
CPC ............... H01L 29/063; H01L 29/7813; H01L 29/1095; H01L 29/086; H01L 21/266; H01L 21/26513; H01L 29/66734; H01L 29/0878; H01L 21/26586; H01L 29/0869; H01L 29/0623; H01L 29/0696
See application file for complete search history.

(56) References Cited

U.S. PATENT DOCUMENTS

| | | | | |
|---|---|---|---|---|
| 2009/0236612 A1* | 9/2009 | Nakamura | .......... | H01L 29/7813 257/77 |
| 2010/0155830 A1* | 6/2010 | Takahashi | .......... | H01L 27/0248 257/328 |
| 2011/0291186 A1* | 12/2011 | Yilmaz | ............. | H01L 29/66719 257/334 |
| 2018/0204918 A1* | 7/2018 | Osuga | ............... | H01L 29/66727 |

FOREIGN PATENT DOCUMENTS

JP    2009-170532 A    7/2009

* cited by examiner

*Primary Examiner* — Marcos D. Pizarro
(74) *Attorney, Agent, or Firm* — Brinks Gilson & Lione

(57) ABSTRACT

A second source portion having an impurity concentration lower than that of a first source portion, both forming a source region, includes a first sub-portion having a depth from a bottom surface of the first source portion down to a second height higher than a first height, and a second sub-portion having an upper surface in contact with a part of a bottom surface of the first sub-portion, one side surface in a second direction perpendicular to a first direction in contact with an outer side surface of the trench, another side surface in the second direction, both side surfaces in the first direction, and a bottom surface in contact with the base layer, and having a depth from a bottom surface of the first sub-portion up to at least the first height.

2 Claims, 18 Drawing Sheets

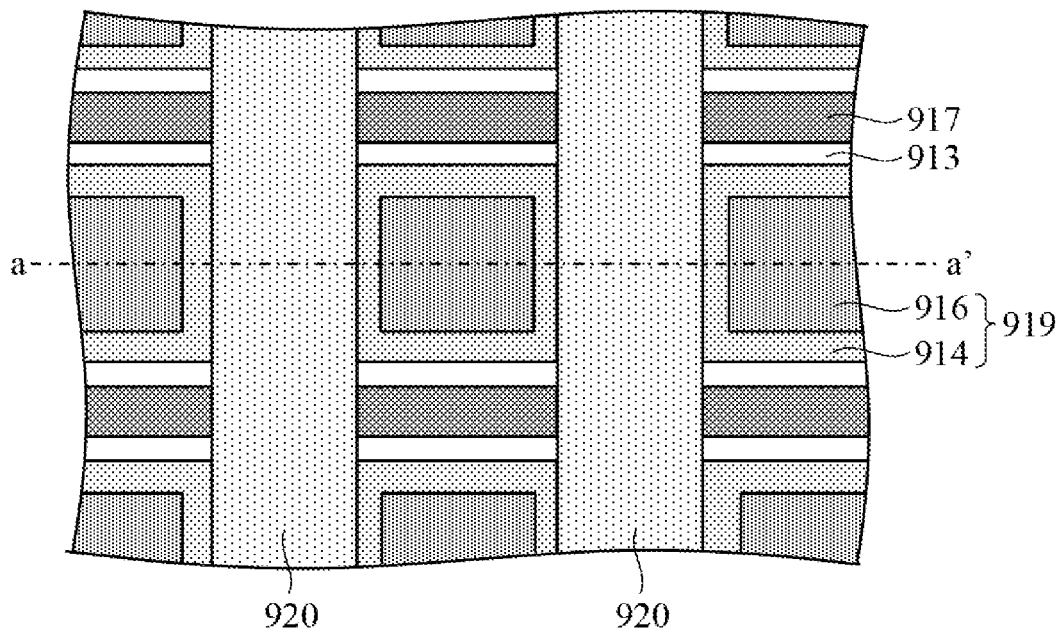
PRIOR ART  FIG. 18A
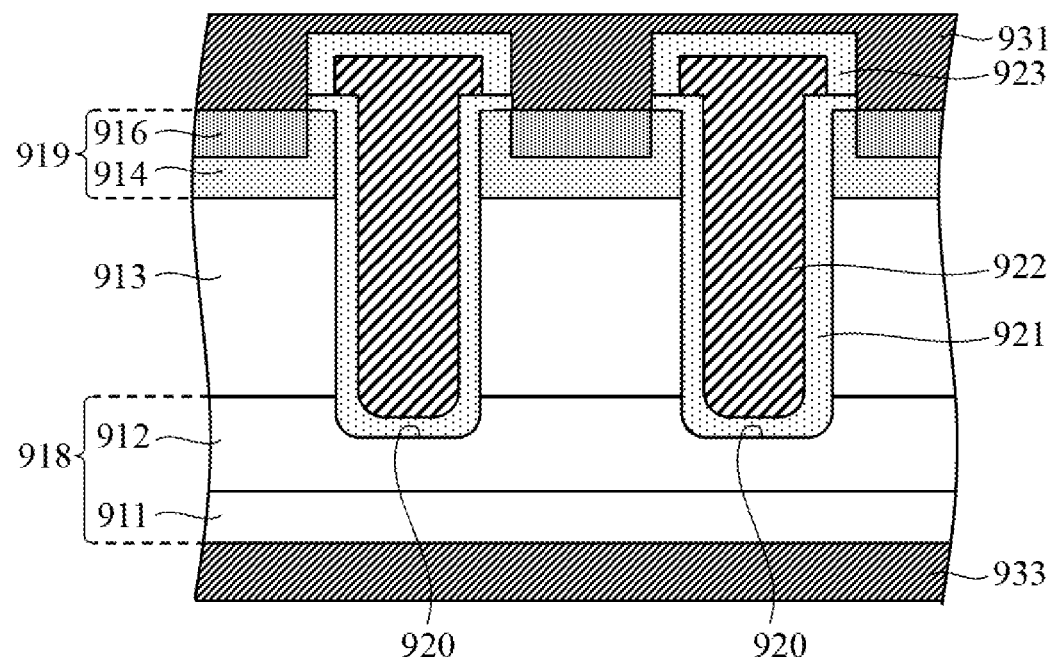
PRIOR ART  FIG. 18B

SEMICONDUCTOR DEVICE AND METHOD OF MANUFACTURING THE SAME

RELATED APPLICATIONS

This application claims priority under 35 U.S.C. § 119 to Japanese Patent Application No. 2018-060315 filed on Mar. 27, 2018, the entire content of which is hereby incorporated by reference.

BACKGROUND OF THE INVENTION

1. Field of the Invention

The present invention relates to a semiconductor device and a method of manufacturing the semiconductor device, and more particularly, to a semiconductor device including a vertical MOSFET and a method of manufacturing the semiconductor device.

2. Description of the Related Art

A conventional semiconductor device including a vertical MOSFET is described with reference to FIG. 18A and FIG. 18B (for example, see Japanese Patent Application Laid-open No. 2009-170532).

FIG. 18A is a plan view of a semiconductor device 900 in prior art. FIG. 18B is a sectional view taken along the line a-a' of FIG. 18A.

As illustrated in FIG. 18A and FIG. 18B, a semiconductor device 900 having a vertical MOSFET includes a drain region 918 constructed from an N-type high-impurity-concentration semiconductor substrate 911 and an N-type semiconductor layer 912, a P-type channel layer (also referred to as a base layer) 913, a source region 919 constructed from an N-type high-impurity-concentration source region 916 and an N-type low-impurity-concentration source region 914 arranged to surround the N-type high-impurity-concentration source region 916, a P-type back gate region (also referred to as a base contact region) 917, a trench 920, a gate insulating film 921, and a gate electrode 922.

The gate electrode 922 protrudes from the trench 920 and is covered by an interlayer insulating film 923. A source electrode 931 is electrically connected to the N-type high-impurity-concentration source region 916 through a contact hole bored in the interlayer insulating film 923.

As illustrated in FIG. 18A, the trench 920 extends in one direction and a plurality of trenches are arranged in stripes. The source region 919 which includes the N-type high-impurity-concentration source region 916 and the N-type low-impurity-concentration source region 914 formed to surround the N-type high-impurity-concentration source region 916 is placed between the adjacent trenches 920 and a plurality of the source regions are arranged in the extending direction of the trenches 920 at a predetermined interval. The base contact region 917 is arranged between the adjacent source regions 919 through intermediation of the base layer 913.

Although not shown, a base electrode which is electrically connected to the base contact layer 917 through another contact hole arranged separately from the one shown above and bored in the interlayer insulating film 923 is arranged in the same layer in parallel to the source electrode 931.

Thus, the source electrode 931 is arranged separately from the base electrode so that the base layer 913 can have a different electric potential from that of the source electrode 931. That is, a vertical MOSFET can be used as a bidirectional switching element through switching between a case in which the base electrode and the source electrode 931 have the same electric potential (grounded) and a case in which the base electrode and the drain electrode 933 have the same electric potential (grounded).

At this time, since the N-type high-impurity-concentration source region 916 is surrounded by the N-type low-impurity-concentration source region 914, and since the source region 919 is separated from the base contact region 917, formation of a PN junction surface having a high impurity concentration can be avoided. It is thus possible to secure a sufficient breakdown voltage between the source region 919 and the base layer 913 even at an application of a high voltage to the source electrodes 931 (the base electrodes and the drain electrodes 933 are grounded).

However, in the conventional semiconductor device 900 including the vertical MOSFET described above, when a higher breakdown voltage between the source region 919 and the base layer 913 is required, in order to secure the breakdown voltage by modifying the N-type low-impurity-concentration source regions 914, the N-type low-impurity-concentration source region 914 should be formed deeper. In that case, the N-type low-impurity-concentration source regions 914 extend not only in a depth direction but also in a direction parallel to the substrate, that is, in the extending direction of the trench 920.

For this reason, it is required to increase the space between the source region 919 and the base contact region 917 so as not to bring the source region 919 in contact with the adjacent base contact region 917. The chip size should therefore be increased, and hence it is difficult to miniaturize the semiconductor device.

SUMMARY OF THE INVENTION

It is therefore an object of the present invention to provide a semiconductor device capable of improving a breakdown voltage between a source region and a base layer of a vertical MOSFET without increasing a chip size, and a method of manufacturing the semiconductor device.

A semiconductor device according to one embodiment of the present invention includes a substrate, a drain region of a first conductivity type arranged on a back surface of the substrate, and having a predetermined thickness, a trench reaching an upper surface of the drain region from a front surface of the substrate and extending in a first direction, a base layer of a second conductivity type arranged on the drain region adjacent to the trench, a gate insulating film covering a bottom surface and a side surface on an inner side of the trench, a gate electrode embedded in the trench from the bottom surface of the trench to a first height through intermediation of the gate insulating film, an interlayer insulating film embedded in the trench from the first height to the front surface of the substrate, a source region including a first source portion of the first conductivity type arranged in the front surface of the substrate and having a side surface in a second direction perpendicular to the first direction in contact with an outer side surface of the trench, and having a first length in the first direction, and a second source portion of the first conductivity type having an impurity concentration lower than an impurity concentration of the first source portion. The second source portion includes a first sub-portion having an upper surface in contact with a bottom surface of the first source portion and a side surface in the second direction in contact with the outer side surface of the trench, having a second length longer than the first length in the first direction, and having a depth from the bottom surface of the first source portion down to a second height higher than the first height, a second sub-portion having an upper surface in contact with a part of a bottom surface of the first sub-portion, one side surface in the second direction in contact with the outer side surface of the trench, another side surface in the second direction, both side surfaces in the first direction, and a bottom surface in contact with the base layer, the second sub-portion having the second length in the first direction and a depth down to at least the first height, and a third sub-portion arranged in the front surface of the substrate and having one side surface in the first direction in contact with the first source portion, another side surface in the first direction in contact with the base layer, a side surface in the second direction in contact with the outer side surface of the trench, and a bottom surface in contact with a part of an upper surface of the first sub-portion. The semiconductor device further includes a base contact region of the second conductivity type arranged in the front surface of the substrate, having both side surfaces in the first direction and a bottom surface in contact with the base layer and a side surface in the second direction in contact with the outer side surface of the trench, and having an impurity concentration higher than an impurity concentration of the base layer and arranged alongside the source region in the first direction, a source electrode electrically connected to the source region and extending in the second direction on the substrate, a base electrode electrically connected to the base contact region and extending in the second direction on the substrate, and a drain electrode arranged on the back surface of the substrate and electrically connected to the drain region.

A method of manufacturing a semiconductor device according to another embodiment of the present invention includes forming a base layer of a second conductivity type to a depth shallower than a thickness of a substrate of a first conductivity type from a front surface of the substrate so that a remaining region of the substrate existing deeper than the base layer is left for a drain region of the first conductivity type, forming a trench extending in a first direction so as to reach the drain region from the front surface of the substrate, forming a gate insulating film on a bottom surface and a side surface on an inner side of the trench, embedding a gate electrode material in the trench through intermediation of the gate insulating film, forming a gate electrode embedding from the bottom surface of the trench to a first height by etching an upper portion of the gate electrode material, forming an impurity region of the first conductivity type by selectively implanting impurities of the first conductivity type into a predetermined region from the front surface of the substrate and an inner side surface of the trench above the first height, embedding an interlayer insulating film in the trench from the first height to the front surface of the substrate, forming a first source portion of the first conductivity type in the front surface of the substrate and a second source portion of the second conductivity type having an impurity concentration lower than an impurity concentration of the first source portion. The first source portion is formed by selectively implanting impurities of the first conductivity type into the impurity region of the first conductivity type from the front surface of the substrate, and has a side surface in a second direction perpendicular to the first direction in contact with an outer side surface of the trench and a first length in the first direction. The second source portion includes a first sub-portion having an upper surface in contact with a bottom surface of the first source portion and a side surface in the second direction in contact with the outer side surface of the trench, having a second length longer than the first length in the first direction, and having a depth from the bottom surface of the first source portion up to a second height higher than the first height, a second sub-portion having an upper surface in contact with a part of a bottom surface of the first sub-portion, one side surface in the second direction in contact with the outer side surface of the trench, and another side surface in the second direction, both side surfaces in the first direction, and a bottom surface in contact with the base layer, the second sub-portion having the second length in the first direction, and having a depth up to at least the first height, and a third sub-portion arranged in the front surface of the substrate and having one side surface in the first direction in contact with the first source portion, another side surface in the first direction in contact with the base layer, a side surface in the second direction in contact with the outer side surface of the trench, and a bottom surface in contact with a part of an upper surface of the first sub-portion. The method further includes forming a base contact region of the second conductivity type in the front surface of the substrate, the base contact region having both side surfaces in the first direction and a bottom surface in contact with the base layer and a side surface in the second direction in contact with the outer side surface of the trench, and having an impurity concentration higher than an impurity concentration of the base layer by selectively implanting impurities of the second conductivity type into a region adjacent to the source region in the first direction from the front surface of the substrate, forming an electrode film on the substrate and patterning the electrode film to form a source electrode electrically connected to the source region and extending in the second direction, and a base electrode electrically connected to the base contact region and extending in the second direction, and forming a drain electrode electrically connected to the drain region on a back surface of the substrate.

According to one embodiment of the present invention, as described above, in the first source portion and the second source portion forming the source region, the second source portion having an impurity concentration lower than that of the first source portion is constructed to include the first sub-portion having a depth from the bottom surface of the first source portion up to the second height higher than the first height which is the upper surface of the gate electrode, and the second sub-portion having the upper surface in contact with the part of the bottom surface of the first sub-portion, one side surface in the second direction perpendicular to the first direction which is the extending direction of the trench in contact with the outer surface of the trench, and another side surface in the second direction, both side surfaces in the first direction, and the bottom surface in contact with the base layer, and having a depth up to at least the first height which is the upper surface of the gate electrode from the bottom surface of the first sub-portion. As a result, in the second sub-portion of the second source portion, a depletion layer extends not only from a PN junction portion between the bottom surface and the base layer but also from a PN junction portion between the side surface and the base layer, and hence the second sub-portion can be completely depleted by the so-called the reduced surface field (RESURF) effect. It is therefore possible to improve a breakdown voltage between the source region and the base layer of the vertical MOSFET without increasing the chip size.

BRIEF DESCRIPTION OF THE DRAWINGS

Embodiments of the invention will now be described, by way of example, with reference to the accompanying drawings, in which:

FIG. 18A is a plan view for illustrating the structure of a semiconductor device in prior art, and FIG. 18B is a sectional view taken along the line a-a' of FIG. 18A.

DETAILED DESCRIPTION OF THE PREFERRED EMBODIMENTS

The invention will now be described herein with reference to illustrative embodiments.

Figure 1:
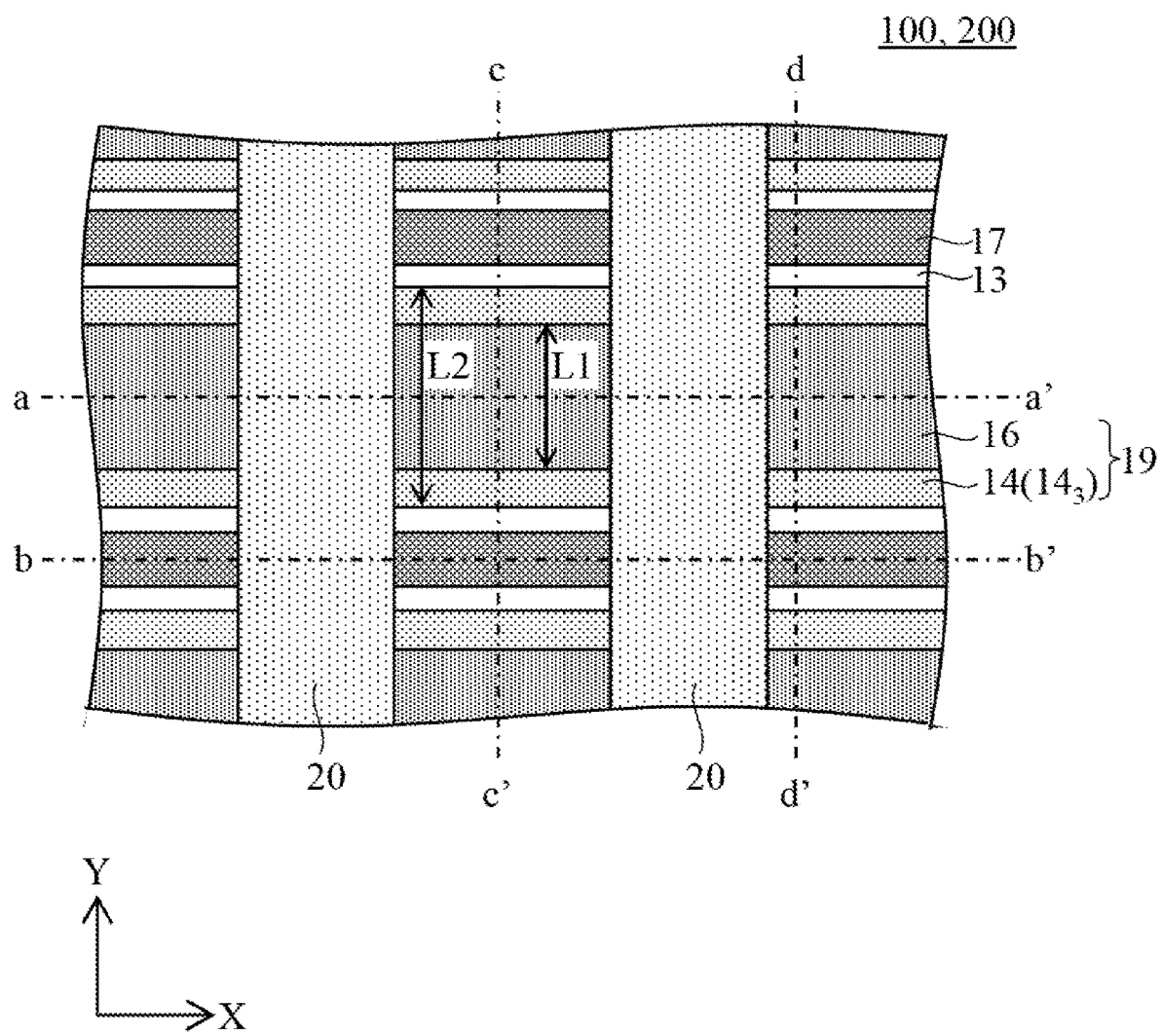
FIG. 1 is a plan view for illustrating the structure of a semiconductor device according to a first embodiment of the present invention.
Figure 2:
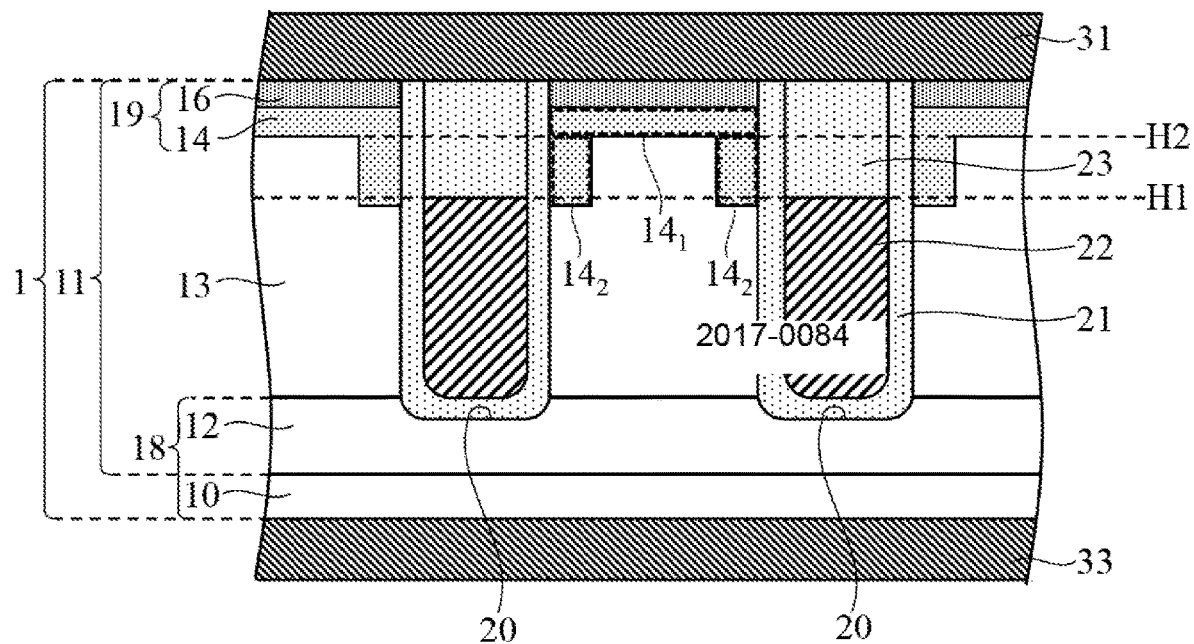
FIG. 2 is a sectional view taken along the line a-a' line of FIG. 1.
Figure 3:
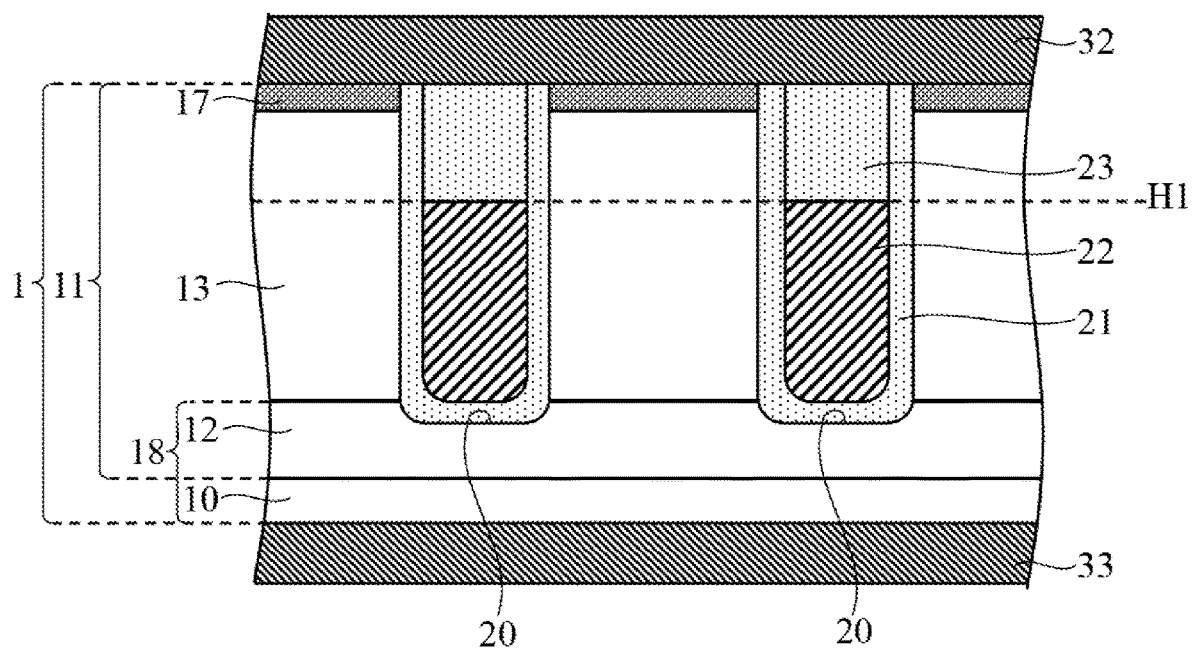
FIG. 3 is a sectional view taken along the line b-b' of FIG. 1.
Figure 4:
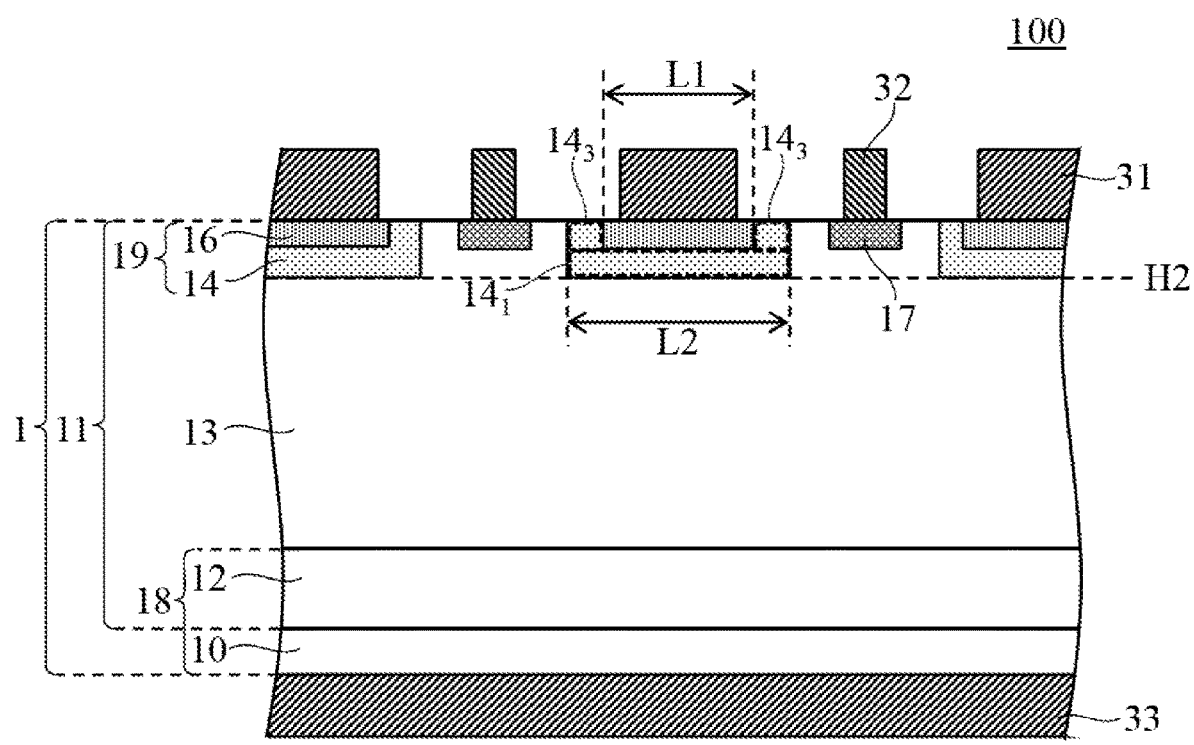
FIG. 4 is a sectional view taken along the line c-c' of FIG. 1.
Figure 5:
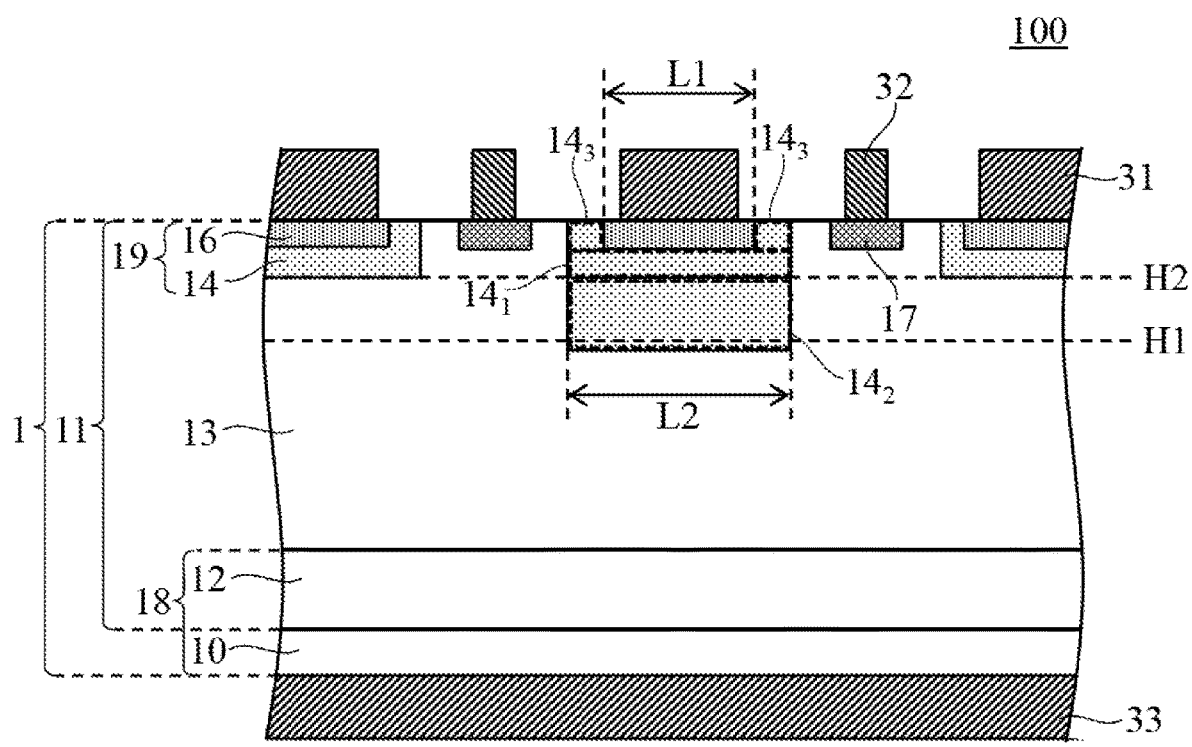
FIG. 5 is a sectional view taken along the line d-d' of FIG. 1.

FIG. 1 is a plan view for illustrating a semiconductor device 100 including a vertical MOSFET according to the first embodiment of the present invention, FIG. 2 is a sectional view taken along the line a-a' of FIG. 1, FIG. 3 is a sectional view taken along the line b-b' of FIG. 1, FIG. 4 is a sectional view taken along the line c-c' of FIG. 1, and FIG. 5 is a sectional view taken along the line d-d' of FIG. 1. The plan view illustrated in FIG. 1 is also common to a semiconductor device 200 of the second embodiment of the present invention which is described later.

As illustrated in FIG. 2 and FIG. 3, the semiconductor device 100 includes an N-type (first conductivity type) semiconductor substrate 10 and an epitaxial layer 11 arranged on the semiconductor substrate 10. The N-type semiconductor substrate 10 and the epitaxial layer 11 are hereinafter collectively referred to as a substrate 1.

The substrate 1 includes a drain region 18 including the semiconductor substrate 10 and an N-type semiconductor layer 12 arranged thereon, P-type (second conductivity type) base layer 13 arranged on the drain region 18, and a trench 20 penetrating through the base layer 13 from a front surface of the substrate 1 (epitaxial layer 11) to reach an upper surface of the drain region 18. The trench 20 is arranged in a stripe in a direction perpendicular to the drawing sheets of FIG. 2 and FIG. 3 (see FIG. 1). Since the semiconductor substrate 10 and the N-type semiconductor layer 12 constitute the drain region 18, the semiconductor substrate 10 is also referred to as the first drain portion and the N-type semiconductor layer 12 as the second drain portion.

In the trench 20, a gate insulating film 21 is formed so as to cover a bottom surface and side surfaces of the trench 20, a gate electrode 22 is embedded from the bottom surface of the trench 20 up to a height H1 through intermediation of the gate insulating film 21, and an interlayer insulating film 23 is embedded in a remaining portion of the trench 20 on the gate electrode 22 up to the front surface of the substrate 1.

As illustrated in FIG. 1, FIG. 4, and FIG. 5, an N-type source portion 16 having a length L1 in the extending direction (Y-direction) of the trench 20 is arranged in a region adjacent to the trench 20 in the front surface of the substrate 1. Further, an N-type source portion 14 having an impurity concentration lower than that of the source portion 16 is arranged so as to cover both side surfaces in the Y-direction and bottom surfaces of the source portion 16. The source portion 16 and the source portion 14 form a source region 19.

As illustrated in FIG. 1, FIG. 2, FIG. 4, and FIG. 5, the source portion 14 is formed to include a first sub-portion $14_1$, a second sub-portion $14_2$, and a third sub-portion $14_3$. Specifically, the first sub-portion $14_1$ has an upper surface in contact with the bottom surface of the source portion 16, and side surfaces in a direction (X-direction) perpendicular to the extending direction of the trenches 20 in contact with outer side surfaces of the trenches 20. The first sub-portion $14_1$ has a length L2 longer than the length L1 in the Y-direction and has a depth from the bottom surface of the source portion 16 up to a height H2 higher than the height H1. The second sub-portion $14_2$ has an upper surface in contact with a part of a bottom surface of the first sub-portion $14_1$, one side surface in the X-direction in contact with the outer side surface of the trench 20, and another side surface in the X-direction, both side surfaces in the Y-direction, and a bottom surface in contact with the base layer 13. The second sub-portion $14_2$ has the same length L2 as that of the first sub-portion $14_1$ in the Y-direction and has a depth up to at least the height H1. The third sub-portion $14_3$ is arranged in the front surface of the substrate 1, and has one side surface in the Y-direction in contact with the source portion 16, another side surface in the Y-direction in contact with the base layer 13, both side surfaces in the X-direction in contact with the outer side surfaces of the trenches 20, and a bottom surface in contact with a part of an upper surface of the first sub-portion $14_1$.

Further, in the front surface of the substrate 1, as illustrated in FIG. 1, FIG. 3, FIG. 4, and FIG. 5, a P-type base contact region 17 having an impurity concentration higher than that of the base layer 13 arranged side by side with the source region 19 in the Y-direction is arranged in the front surface of the substrate 1. The base contact region 17 has both side surfaces in the Y-direction and a bottom surface in contact with the base layer 13 so as to be separated from the source region 19, and side surfaces in the X-direction in contact with the outer side surfaces of the trenches 20.

As illustrated FIG. 2, FIG. 4, and FIG. 5, on the substrate 1, a source electrode 31 is arranged and electrically connected to the source region 19 and extending in the X-direction. Further, as illustrated in FIG. 3, FIG. 4, and FIG. 5, on the substrate 1, a base electrode 32 is arranged and electrically connected to the base contact region 17 and extending in the X-direction, that is, alongside the source electrode 31. The source electrode 31 is electrically insulated by an insulating film (not shown) from the base electrode 32.

Further, as illustrated in FIG. 2 to FIG. 5, a drain electrode 33 is arranged and electrically connected to the drain region 18 on a back surface of the substrate 1.

As described above, in the first embodiment, the source region 19 includes the source portion 16 and the source portion 14 having an impurity concentration lower than that of the source portion 16. The source portion 14 having a low impurity concentration has a structure (RESURF structure) to include the first sub-portion $14_1$ and the second sub-portions $14_2$. The first sub-portion $14_1$ has the depth from the bottom surface of the source portion 16 up to the height H2 which is higher than the height H1 as the height of the upper surface of the gate electrode 22. The second sub-portion $14_2$ includes the upper surface in contact with the part of the bottom surface of the first sub-portion $14_1$, the one side surface in the X-direction perpendicular to the extending direction (Y-direction) of the trench 20 in contact with the outer side surface of the trench 20, and the another surface in the X-direction, the both side surfaces in the Y-direction and the bottom surface in contact with the base layer 13, and has the depth from the bottom surface of the first sub-portion $14_1$ to at least the height H1. With this structure, in the second sub-portion $14_2$ of the source portion 14, depletion layers extend not only from a PN junction portion between the bottom surface and the base layer 13 but also extend from a PN junction portion between the side surface and the base layer 13. The second sub-portion $14_2$ is completely depleted by the RESURF effect, and hence an electric field between the source region 19 and the base layer 13 is relaxed. Without increasing the chip size, the breakdown voltage between the source region 19 and the base layer 13 of the vertical MOSFET can therefore be improved, and the vertical MOSFET can be used as a bidirectional switching element having a high breakdown voltage.

Figure 6:
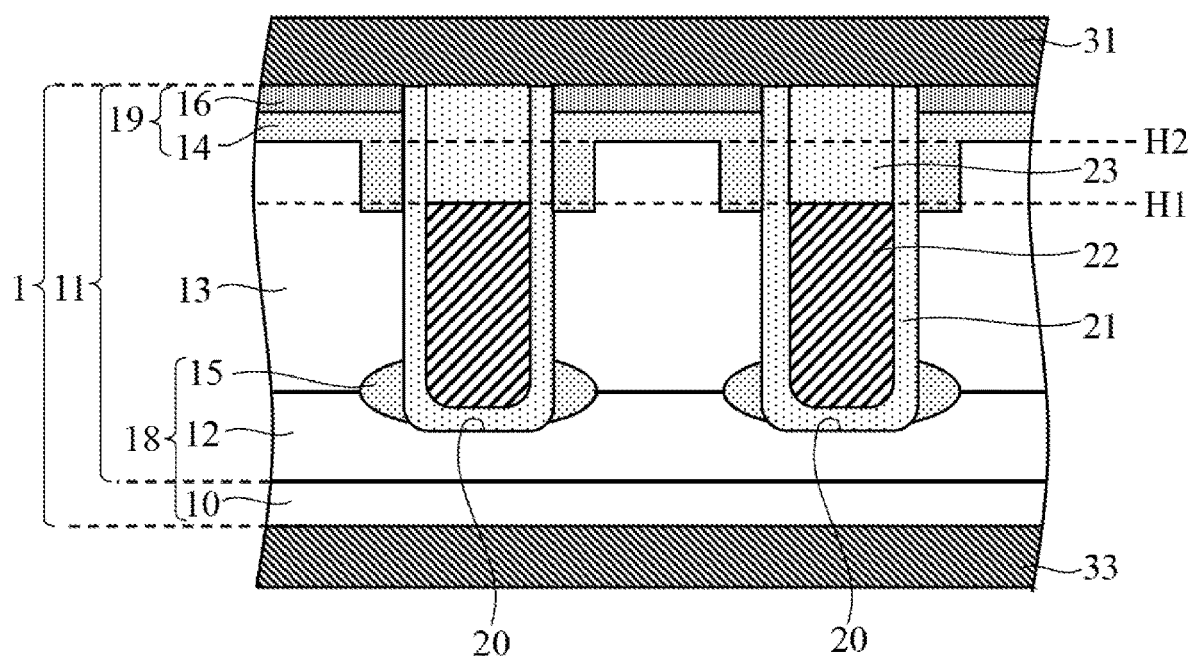
FIG. 6 is a sectional view taken along the line a-a' of FIG. 1 for illustrating the structure of a semiconductor device according to a second embodiment of the present invention.

Next, a semiconductor device 200 including a vertical MOSFET according to the second embodiment of the present invention is described with reference to FIG. 1 and FIG. 6. FIG. 6 is a sectional view taken along the line a-a' of FIG. 1.

In the semiconductor device 200 according to the second embodiment, the structure of the drain region 18 is different from that of the semiconductor device 100 according to the first embodiment. Other components are identical to those of the semiconductor device 100, and hence the same components are denoted by the same reference numerals, and redundant description is omitted as appropriate.

The drain region 18 in the semiconductor device 200 of the second embodiment includes an N-type third drain portion 15 in addition to the semiconductor substrate 10 and the semiconductor layer 12, respectively referred to as the first drain portion and the second drain portion. The third drain portion 15 is formed to extend to the semiconductor layer 12 and the base layer 13 on an outer side surface of the bottom of the trench 20. The third drain portion 15 includes a side surface in contact with the outer side surface of the trench 20, an upper surface in contact with the base layer 13, and a lower surface connected to the semiconductor layer 12. The third drain portion 15 has an impurity concentration higher than that of the semiconductor layer 12, and further has the same impurity concentration as that of the source portion 14. It is preferred that the bottom surfaces of the trench 20 is in contact with the semiconductor layer 12 so as to prevent lowering of the breakdown voltage.

According to the second embodiment, the third drain portion 15 having an impurity concentration higher than that of the semiconductor layer 12 is thus arranged in a current path from the source electrode 31 to the drain electrode 33. It is therefore possible to reduce on-resistance of the vertical MOSFET lower than that of the vertical MOSFET in the semiconductor device 100 of the first embodiment.

Here, suppose that, instead of the third drain portion 15, an N-type layer having an impurity concentration higher than that of the semiconductor layer 12 were formed as a portion of the drain region 18 on the semiconductor layer 12, though the on-resistance would be reduced, the breakdown voltage between the drain region 18 and the base layers 13 would decrease. Meanwhile, in the second embodiment, the third drain portion 15 having an impurity concentration higher than that of the semiconductor layer 12 is formed to have the structure described above, and hence the drain portion 15 are configured to function in the drain region 18 equally to the second sub-portions $14_2$ of the source portions 14 in the source regions 19. That is, the electric field between the drain region 18 and the base layer 13 is relaxed by the RESURF effect. According to the second embodiment, it is therefore possible to reduce the on-resistance without reducing the breakdown voltage between the drain region 18 and the base layer 13.

Next, an example of the method of manufacturing the semiconductor device 200 according to the second embodiment is described with reference to sectional views along process steps illustrated in FIG. 7 to FIG. 17.

Figure 7:
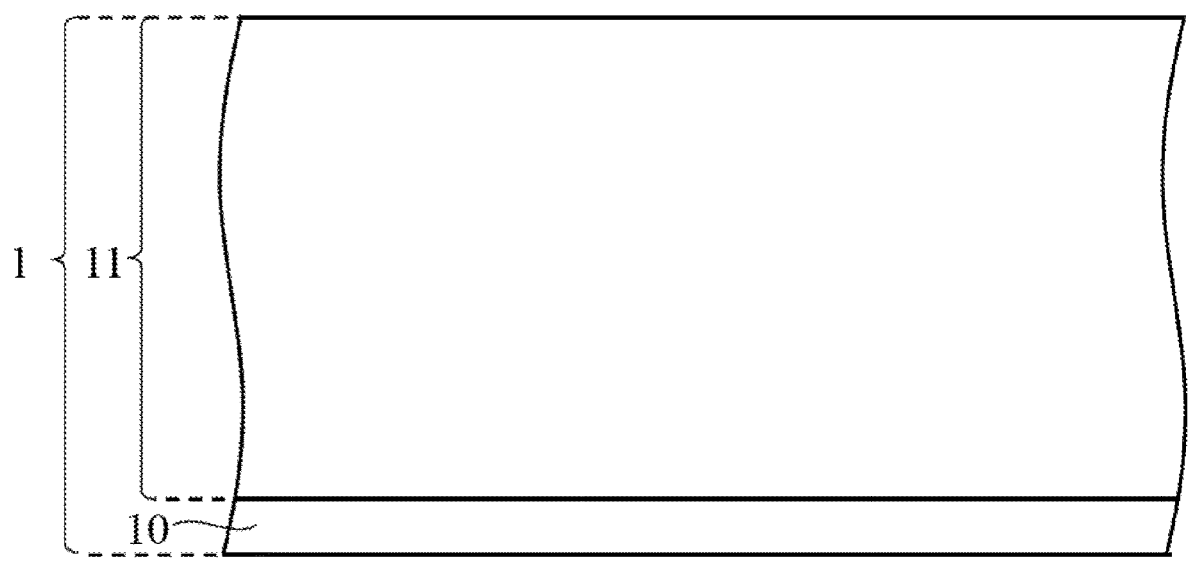
FIG. 7 is a sectional view for illustrating a method of manufacturing the semiconductor device according to the second embodiment of the present invention.

As illustrated in FIG. 7, the epitaxial layer 11 doped with N-type impurities is formed by epitaxial growth on the semiconductor substrate 10 doped with N-type impurities having a high impurity concentration, thereby constituting a substrate 1 which includes the semiconductor substrate 10 having a high impurity concentration and the epitaxial layer 11.

Figure 8:
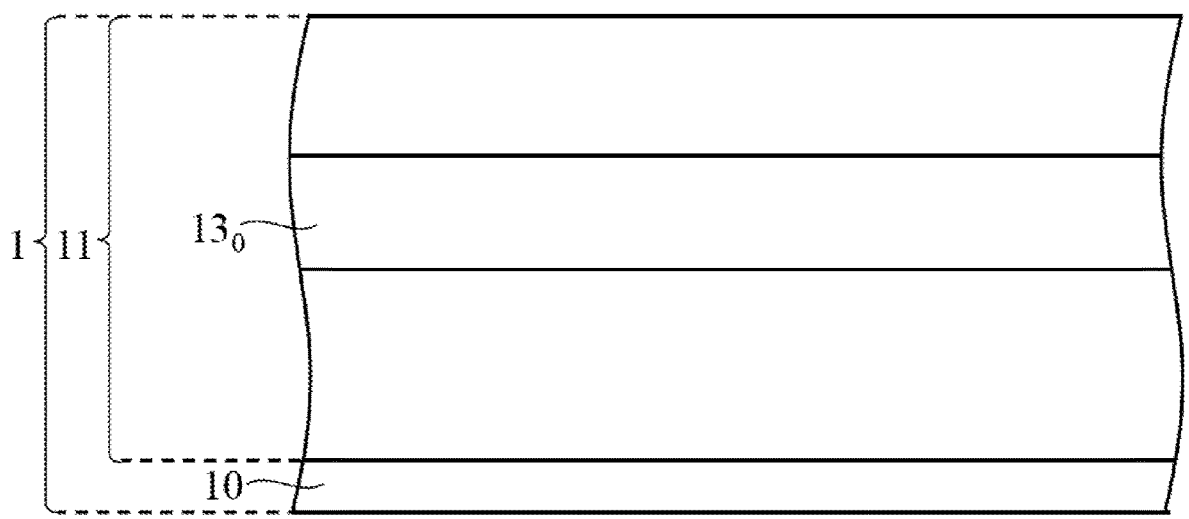
FIG. 8 is a sectional view for illustrating the method of manufacturing the semiconductor device according to the second embodiment of the present invention.

Then, P-type impurities are doped with high energy from the upper surface of the epitaxial layer 11 (substrate 1) so that a P-type impurity region $13_0$ is formed at a deep position in the epitaxial layer 11 as illustrated in FIG. 8.

Figure 9:
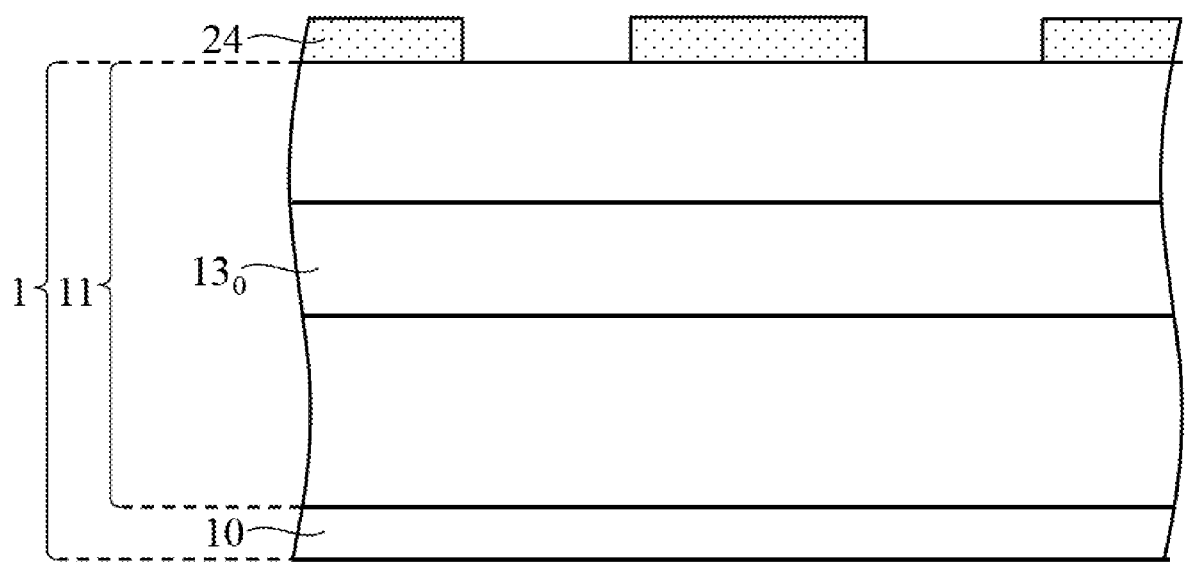
FIG. 9 is a sectional view for illustrating the method of manufacturing the semiconductor device according to the second embodiment of the present invention.
Figure 10:
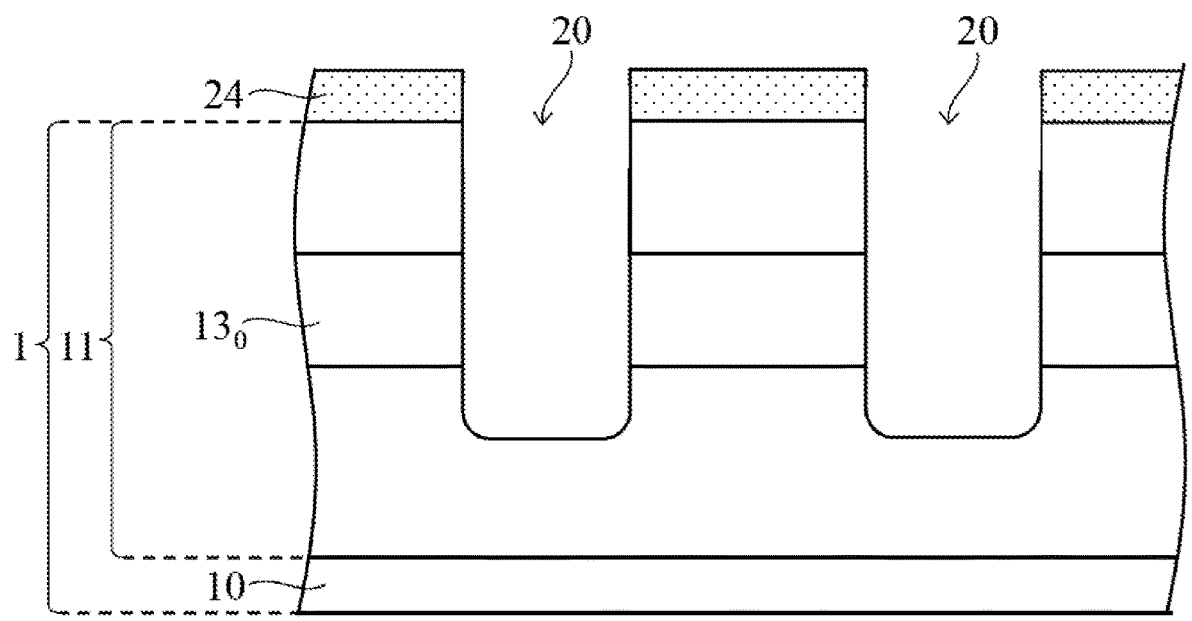
FIG. 10 is a sectional view for illustrating the method of manufacturing the semiconductor device according to the second embodiment of the present invention.

Next, after an insulating film 24 is formed on the front surface of the substrate 1 by the CVD method or the like, a photoresist pattern (not shown) having an opening above a region in which the trench 20 is made is formed by photolithography, and the insulating film 24 is patterned using the photoresist pattern as a mask. As illustrated in FIG. 9, an opening is formed in a region of the insulating films 24 in which the trench 20 is made. Then, the epitaxial layer 11 is etched using the insulating film 24 as a mask. As a result, as illustrated in FIG. 10, the trench 20 is made so as to penetrate the P-type impurity region $13_0$.

Figure 11:
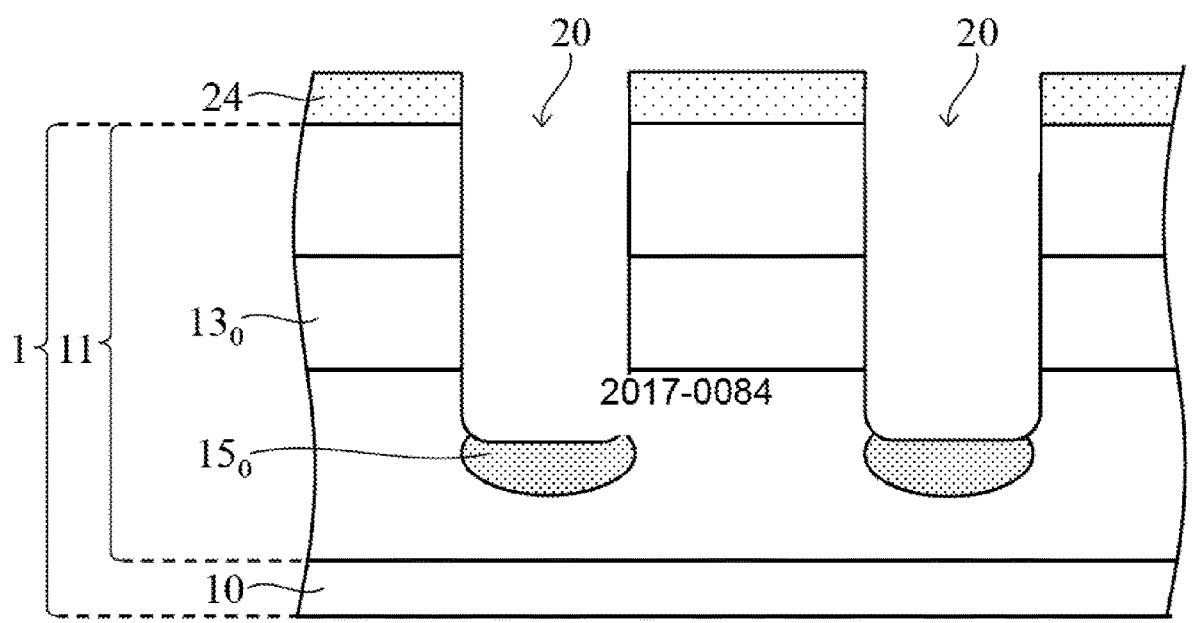
FIG. 11 is a sectional view for illustrating the method of manufacturing the semiconductor device according to the second embodiment of the present invention.

Next, as illustrated in FIG. 11, an N-type impurity region $15_0$ is formed at the bottoms of the trench 20 by doping N-type impurities using the insulating film 24 as a mask.

Figure 12:
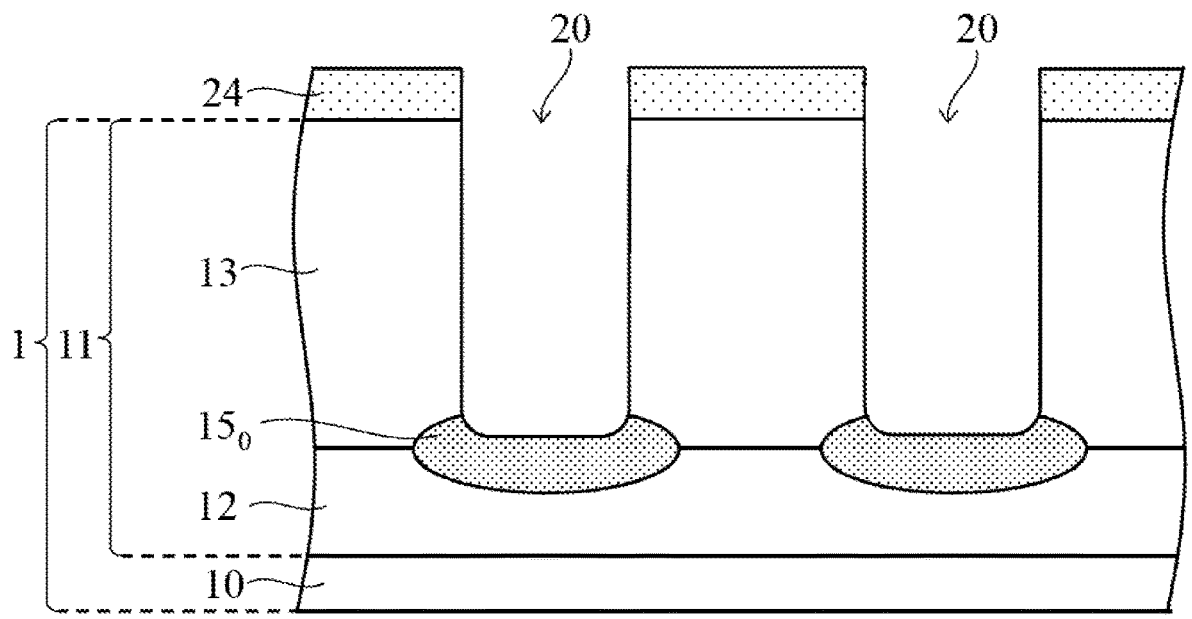
FIG. 12 is a sectional view for illustrating the method of manufacturing the semiconductor device according to the second embodiment of the present invention.

Then, with heat treatment, as illustrated in FIG. 12, the P-type impurities in the impurity region $13_O$ are diffused up to the front surface of the substrate 1, and the N-type impurities in the impurity region $15_O$ are diffused so as to cover the side surface at the bottom of the trench 20 to form the base layer 13 having a depth covering at least a part of the upper side of the N-type impurity region $15_O$ from the front surface of the substrate 1. As a result, the N-type semiconductor layer 12 remains at the bottom of the epitaxial layer 11.

Figure 13:
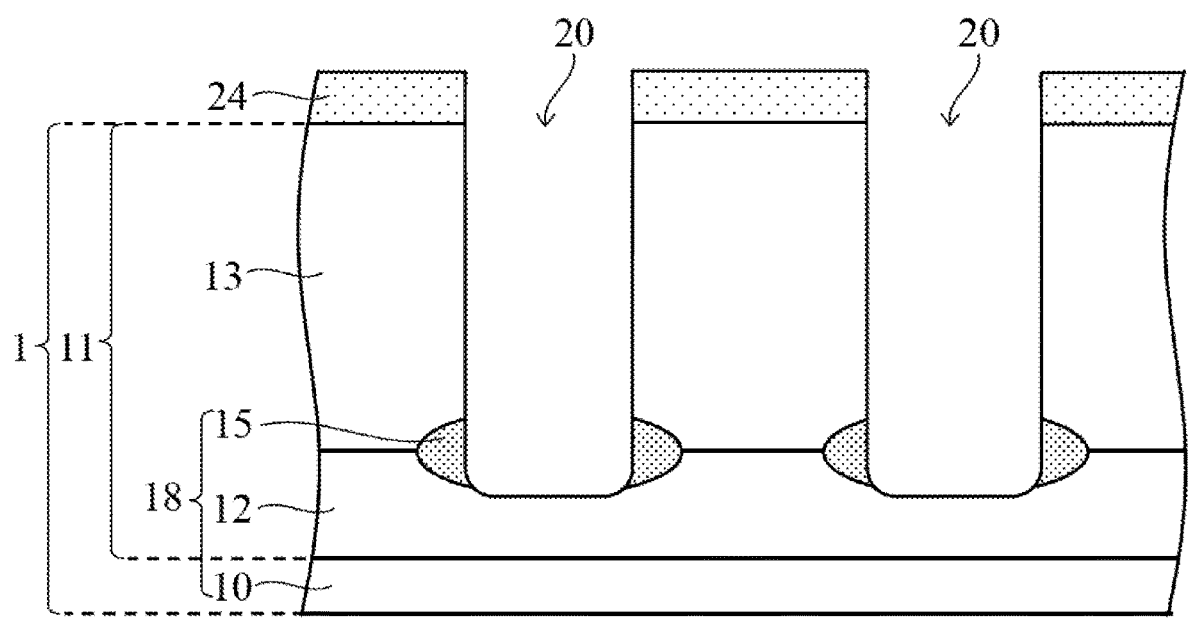
FIG. 13 is a sectional view for illustrating the method of manufacturing the semiconductor device according to the second embodiment of the present invention.

Subsequently, as illustrated in FIG. 13, the bottom of the trench 20 is further dug down using the insulating film 24 as a mask, and the N-type impurity region $15_O$ remaining under the bottom surface of the trench 20 is removed by etching. As a result, the N-type third drain portion 15 having an impurity concentration higher than that of the semiconductor layer 12 is formed. The third drain portion 15 is in contact with the outer surface of the trench 20 and has the upper surface in contact with the base layer 13 and the lower surface connected to the semiconductor layer 12.

Next, after the insulating film 24 is removed, the gate insulating film 21 is formed on entire surface including the bottom surface and the side surface of the trench 20 by, for example, thermal oxidation. At this time, the insulating film 25 is formed on the front surface of the substrate 1 simultaneously with the gate insulating film 21.

Figure 14:
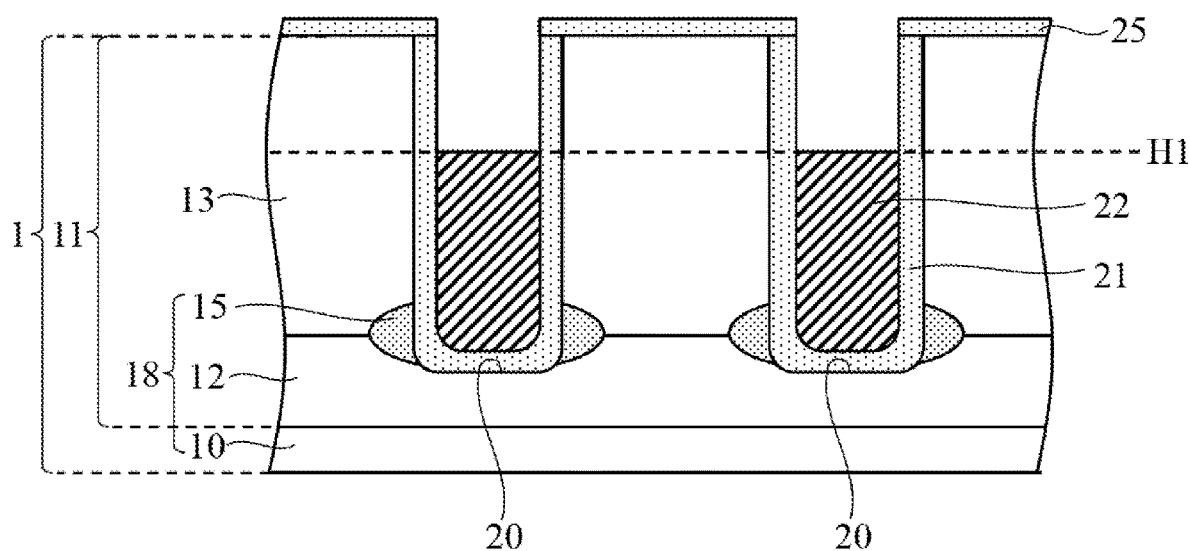
FIG. 14 is a sectional view for illustrating the method of manufacturing the semiconductor device according to the second embodiment of the present invention.

Subsequently, a gate electrode material is embedded in the trench 20 and is then etched back to the height H1 to form the gate electrode 22 as illustrated in FIG. 14.

Figure 15:
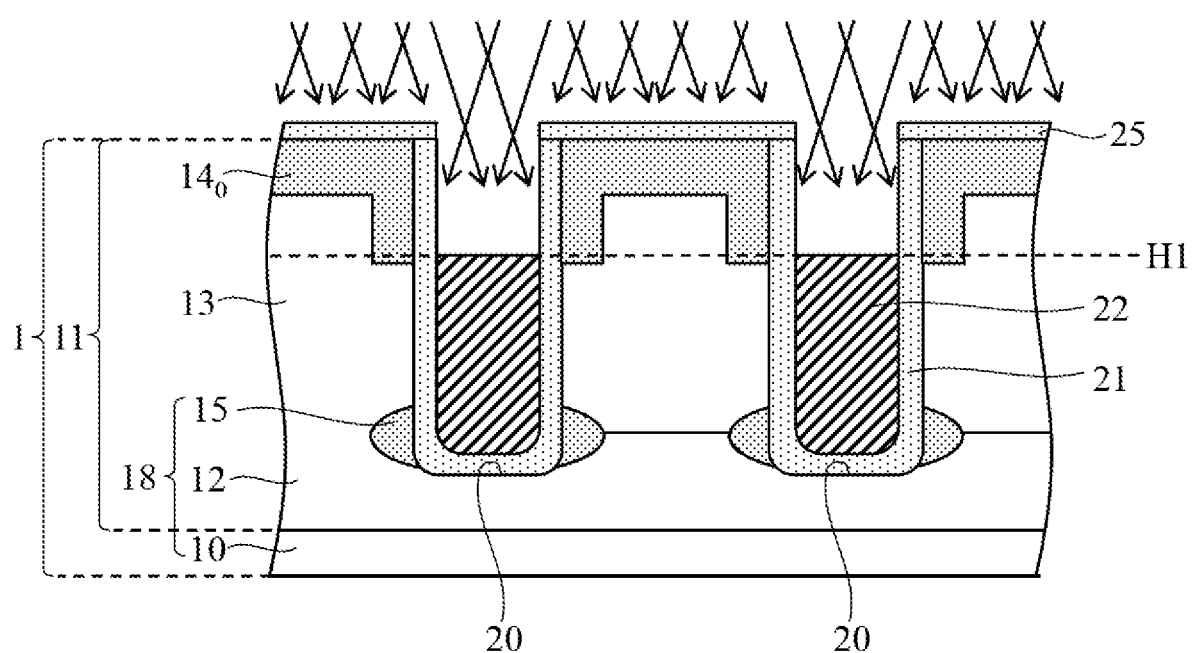
FIG. 15 is a sectional view for illustrating the method of manufacturing the semiconductor device according to the second embodiment of the present invention.

Next, as illustrated in FIG. 15, under a state in which a photoresist pattern (not shown) is formed to cover regions excluding regions in which the source portions 14 are formed, N-type impurities are obliquely ion-implanted through the gate insulating film 21 and the insulating film 25 on an entire surface including the inner side surface of the trench 20. Accordingly, an N-type impurity region $14_O$ is selectively formed along the front surface of the substrate 1 and the side surface of the trench 20. At this time, a lower end of the N-type impurity region $14_O$ is formed to be equal to or slightly deeper than the height H1 which is the upper surface of the gate electrode 22. That is, the N-type impurity region $14_O$ is formed in a self-aligned manner to the gate electrode.

Figure 16:
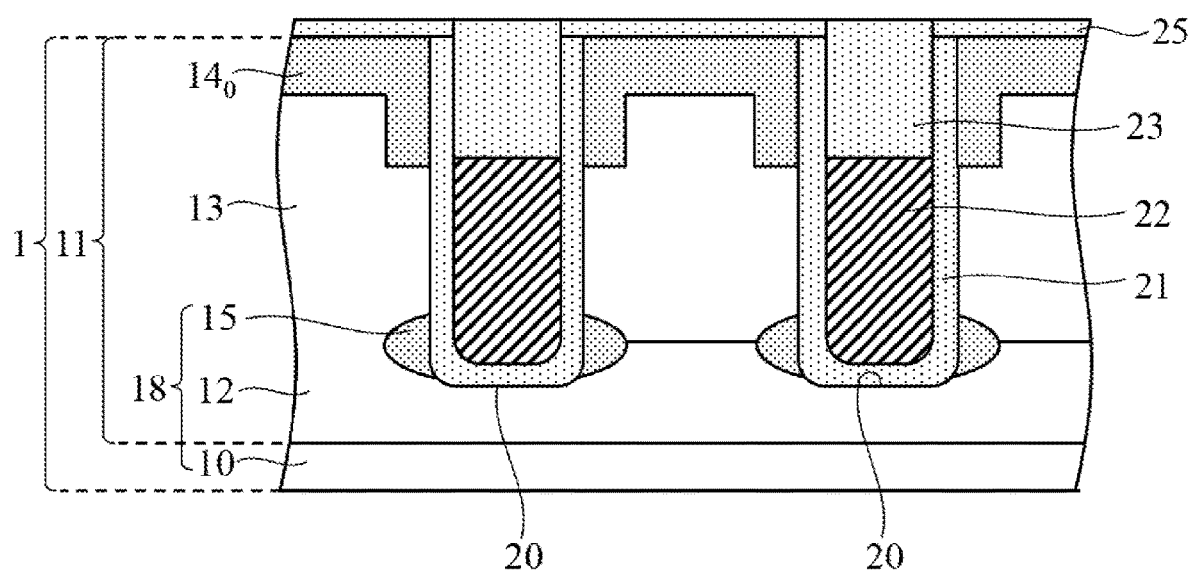
FIG. 16 is a sectional view for illustrating the method of manufacturing the semiconductor device according to the second embodiment of the present invention.

Next, as illustrated in FIG. 16, an insulating film is embedded in the remaining portion on the gate electrode 22 in the trench 20 and is etched back to form the interlayer insulating film 23.

Figure 17:
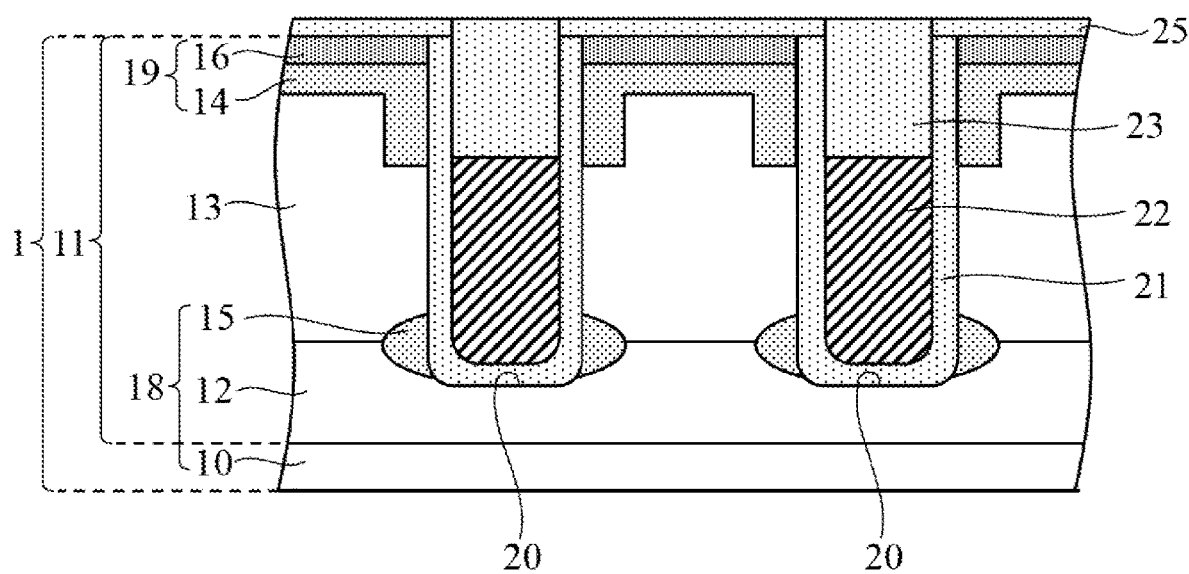
FIG. 17 is a sectional view for illustrating the method of manufacturing the semiconductor device according to the second embodiment of the present invention.

Then, as illustrated in FIG. 17, under a state in which a photoresist pattern (not shown) is formed to cover regions excluding regions in which the source portion 16 is formed, N-type impurities are ion-implanted from the front surface of the substrate 1 into the N-type impurity region $14_O$ through the gate insulating film 25. Accordingly, the N-type impurity region 16 is selectively formed, and the remaining portion of the N-type impurity region $14_O$ turns to be the source portion 14. The source region 19 is thus formed to include the source portion 14 and the source portion 16.

Subsequently, under a state in which a photoresist pattern (not shown) is formed to cover regions excluding regions in which the base contact region 17 is formed, P-type impurities are doped from the front surface of the substrate 1 through the insulating films 25. Thus, as illustrated in FIG. 1, the base contact region 17 is formed on the front surface of the substrate 1.

Then, after the insulating film 25 remaining on the substrate 1 and upper portions of the interlayer insulating film 23 is removed, a metal layer is formed on the entire front surface of the substrate 1. A photoresist (not shown) is patterned by photolithography so as to have openings through which regions contacting the source portions 16 and regions contacting the base contact regions 17 are exposed. The metal layer is etched using the photoresist as a mask. Thus, the source electrode 31 electrically connected to the source region 19 and the base electrode 32 electrically connected to the base contact region 17 are formed (see FIG. 4 and FIG. 5).

Further, the drain electrode 33 electrically connected to the drain region 18 is formed on the entire back surface of the substrate 1. The semiconductor device 200 of the second embodiment illustrated in FIG. 6 is thus obtained.

The semiconductor device 100 according to the first embodiment is substantially the same as the semiconductor device 200 according to the second embodiment except for the structure of the third drain portion 15, and hence a method of manufacturing the semiconductor device 100 of the first embodiment is omitted. However, the semiconductor device 100 according to the first embodiment can be obtained by omitting the step of forming the third drain portion 15 illustrated in FIG. 11 to FIG. 13 from the method of manufacturing the semiconductor device 200 according to the second embodiment.

The embodiments of the present invention have been described above. It is apparent that the present invention is not limited to the above embodiments and may be modified and changed without departing from the scope and spirit of the invention.

In the above-mentioned embodiments, the first conductivity type is described as an N-type, and the second conductivity type is described as P-type. However, the conductivity type may be changed, and the first conductivity type may be a P-type, and the second conductivity type may be an N-type.

What is claimed is:

1. A semiconductor device, comprising:
   a substrate,
   a drain region of a first conductivity type arranged on a back surface of the substrate, and having a predetermined thickness,
   a trench reaching an upper surface of the drain region from a front surface of the substrate and extending in a first direction,
   a base layer of a second conductivity type arranged on the drain region adjacent to the trench,
   a gate insulating film covering a bottom surface and a side surface on an inner side of the trench,
   a gate electrode embedded in the trench from the bottom surface of the trench to a first height through intermediation of the gate insulating film,
   an interlayer insulating film embedded in the trench from the first height to the front surface of the substrate,
   a source region comprising:
      a first source portion of the first conductivity type arranged in the front surface of the substrate, having a side surface in a second direction perpendicular to the first direction in contact with an outer side surface of the trench, and having a first length in the first direction, and
      a second source portion of the first conductivity type having an impurity concentration lower than an impurity concentration of the first source portion, and comprising:
         a first sub-portion having an upper surface in contact with a bottom surface of the first source portion and a side surface in the second direction in contact with the outer side surface of the trench, having a second length longer than the first length in the first direction, and having a depth from the bottom surface of the first source portion down to a second height higher than the first height,
- a second sub-portion having an upper surface in contact with a part of a bottom surface of the first sub-portion, one side surface in the second direction in contact with the outer side surface of the trench, another side surface in the second direction, both side surfaces in the first direction, and a bottom surface in contact with the base layer, the second sub-portion having the second length in the first direction and a depth down to at least the first height, and
- a third sub-portion arranged in the front surface of the substrate, and having one side surface in the first direction in contact with the first source portion, another side surface in the first direction in contact with the base layer, a side surface in the second direction in contact with the outer side surface of the trench, and a bottom surface in contact with a part of an upper surface of the first sub-portion, a base contact region of the second conductivity type arranged in the front surface of the substrate, having both side surfaces in the first direction and a bottom surface in contact with the base layer and a side surface in the second direction in contact with the outer side surface of the trench, and having an impurity concentration higher than an impurity concentration of the base layer and arranged alongside the source region in the first direction, a source electrode electrically connected to the source region and extending in the second direction on the substrate, a base electrode electrically connected to the base contact region and extending in the second direction on the substrate, and a drain electrode arranged on the back surface of the substrate and electrically connected to the drain region.

2. The semiconductor device according to claim 1, wherein the drain region comprises:
- a first drain portion of the first conductivity type in contact with the drain electrode,
- a second drain portion of the first conductivity type arranged on a surface of the first drain portion opposite to the drain electrode, and having an impurity concentration lower than an impurity concentration of the second source portion, and
- a third drain portion of the first conductivity type having a side surface in contact with the outer side surface of the trench, an upper surface in contact with the base layer, and a lower surface connected to the second drain portion, and having the same order of impurity concentration as the impurity concentration of the second source portion.

* * * * *